(12) United States Patent
Dhori

(10) Patent No.: US 12,165,698 B2
(45) Date of Patent: Dec. 10, 2024

(54) CIRCUITRY FOR ADJUSTING RETENTION VOLTAGE OF A STATIC RANDOM ACCESS MEMORY (SRAM)

(71) Applicant: STMicroelectronics International N.V., Geneva (CH)

(72) Inventor: Kedar Janardan Dhori, Ghaziabad (IN)

(73) Assignee: STMicroelectronics International N.V., Geneva (CH)

( * ) Notice: Subject to any disclaimer, the term of this patent is extended or adjusted under 35 U.S.C. 154(b) by 141 days.

(21) Appl. No.: 17/483,501

(22) Filed: Sep. 23, 2021

(65) Prior Publication Data

US 2022/0130454 A1 Apr. 28, 2022

Related U.S. Application Data

(60) Provisional application No. 63/104,222, filed on Oct. 22, 2020.

(51) Int. Cl.
*G11C 11/417* (2006.01)
*G11C 11/412* (2006.01)

(52) U.S. Cl.
CPC .......... *G11C 11/417* (2013.01); *G11C 11/412* (2013.01)

(58) Field of Classification Search
CPC ..... G11C 11/41; G11C 11/412; G11C 11/413; G11C 11/417; G11C 11/418; G11C 11/419

See application file for complete search history.

(56) References Cited

U.S. PATENT DOCUMENTS

| | | |
|---|---|---|
| 7,400,545 B2 * | 7/2008 | Ramaraju ............. G11C 11/413 365/154 |
| 8,917,561 B2 | 12/2014 | Asthana |
| 9,123,436 B2 | 9/2015 | Chiou et al. |
| 9,165,641 B2 | 10/2015 | Gulati et al. |

(Continued)

OTHER PUBLICATIONS

Kumar, Ashish et: "A 0.6V Retention VMIN Ultra-Low Leakage High Density 6T SRAM in 40nm CMOS Technology Using Adaptive Source Bias," 2018 31st Internatinal Conference on VLSI Design and 2018 17th AInternational Conference on Embedded Systems (VLSID), 3 pages.

(Continued)

*Primary Examiner* — Sung Il Cho
(74) *Attorney, Agent, or Firm* — Crowe & Dunlevy LLC

(57) ABSTRACT

A static random access memory (SRAM) device disclosed herein includes an array of SRAM cells powered between first and second voltages. A reference voltage generator generates a reference voltage that is proportional to absolute temperature, with a magnitude curve of the reference voltage being based upon a control word. A low dropout amplifier sets and maintains the second voltage as being equal to the reference voltage. Control circuitry generates the control word based upon process variation information about the SRAM device. In one instance, the control circuitry monitors a canary bit-cell and increments the control word, to thereby increase the magnitude curve of the reference voltage, until the canary bit-cell fails. In another instance, the control circuitry measures the oscillation frequency of a ring oscillator, and selects the control word based upon the measured oscillation frequency.

22 Claims, 7 Drawing Sheets

(56) References Cited

U.S. PATENT DOCUMENTS

| | | | | |
|---|---|---|---|---|
| 9,324,451 | B2* | 4/2016 | Gupta | G11C 7/12 |
| 9,378,805 | B2* | 6/2016 | Walsh | G11C 7/04 |
| 9,792,979 | B1* | 10/2017 | Dreesen | G11C 7/04 |
| 9,922,699 | B1* | 3/2018 | Sinangil | G11C 11/412 |
| 2004/0227542 | A1* | 11/2004 | Bhavnagarwala | H03K 19/0016 |
| | | | | 326/83 |
| 2006/0050590 | A1* | 3/2006 | Nautiyal | G11C 11/413 |
| | | | | 365/226 |
| 2006/0206739 | A1* | 9/2006 | Kim | G11C 7/02 |
| | | | | 713/322 |
| 2007/0147159 | A1* | 6/2007 | Lee | G11C 29/028 |
| | | | | 365/211 |

OTHER PUBLICATIONS

Wang, Jiajing, et al: "Techniques to Extend Canary-Based Standby Vdd Scaling for SRAMs to 45 nm and Beyond," IEEE Journal of Solid-State Circuits, vol. 43, No. 11, Nov. 2008, 10 pages.

Kapoor, Ajy et al: "Leakage Mitigation for Low Power Microcontroller Design in 40nm for Internet-of-Things (IoT)," 2016 IEEE 22nd International Symposium on On-Line Testing and Robust System Design (IOLTS), 3 pages.

* cited by examiner

CIRCUITRY FOR ADJUSTING RETENTION VOLTAGE OF A STATIC RANDOM ACCESS MEMORY (SRAM)

RELATED APPLICATION

This application claims priority to U.S. Provisional Application for Patent No. 63/104,222, filed Oct. 22, 2020, the contents of which are incorporated by reference in their entirety to the maximum extent allowable under the law.

TECHNICAL FIELD

This disclosure is directed to the field of static random access memory (SRAM) devices and, in particular, to a circuit for setting the retention mode voltage for an SRAM to track temperature and process so as to reduce power consumption.

BACKGROUND

A conventional SRAM cell 1 is shown in FIG. 1. The SRAM cell 1 is formed from cross coupled inverters 2 and 3. The inverter 2 includes a p-channel transistor MP1 having a source coupled to an SRAM supply voltage VDDX received from an SRAM supply voltage generator 4 that generates the SRAM supply voltage VDDX from a supply voltage VCC, a drain coupled to the drain of an n-channel transistor MN1, and a gate coupled to the gate of the n-channel transistor MN1. The n-channel transistor MN1 has its source coupled to an SRAM ground voltage GNDX received from an SRAM ground voltage generator 5 that generates the SRAM supply voltage GNDX. The inverter 3 includes a p-channel transistor MP2 having a source coupled to the SRAM supply voltage VDDX, a drain coupled to the drain of an n-channel transistor MN2, and a gate coupled to the gate coupled to the gate of the n-channel transistor MN2. The n-channel transistor MN2 has its source coupled to the SRAM ground voltage GNDX.

N-channel pass gate transistors PG1 and PG2 selectively connect the outputs of the cross coupled inverters 2 and 3 to a bit line BL and a complementary bit line BLB, respectively. The pass gate transistors PG1 and PG2 are selectively activated by a word line signal on a word line WL.

The disclosures herein focus on when the SRAM cell 1 is in retention mode, that is, when neither a write operation nor a read operation is being performed, and instead, the SRAM 1 is simply operating to retain the current state of its inverters 2 and 3. Therefore, circuitry for performing reads and writes is not shown for sake of brevity.

When the SRAM cell 1 is to perform a read or a write, the VDDX generator 4 and the GNDX generator 5 set VDDX and GNDX such that the voltage therebetween (VDDX-GNDX) is sufficient to permit the read or write to be performed.

However, in retention mode, the voltage between which the inverters 2 and 3 are powered (that is, VDDX-GNDX) can be less than when a write operation or a read operation is to be performed. Therefore, the VDDX generator 4 and GNDX generator 5 set VDDX and GNDX such that the difference therebetween (VDDX-GNDX) is lower than during read/write mode. However, if this retention voltage is too low, then the states of the inverters 2 and 3 may change, and the data stored in that SRAM cell 1 will be lost.

Conventionally, the SRAM supply voltage generator 4 and the SRAM ground voltage generator 5 are designed so that the retention voltage will be sufficient for even the worst process corner of the slowest lots of SRAM die expected to be produced. However, while this does produce an SRAM cell that effectively retains its state in retention mode, such a design is inefficient, as better performing lots of SRAM die are able to operate with a lower retention voltage than worse performing lots. Therefore, many die produced operate with a higher retention voltage than needed to retain data in retention mode, leading to increased leakage currents, and therefore excess power consumption. Since many devices into which SRAMs are placed these days are battery operated (for example, smartphones), this excess power consumption is undesirable. This excess power consumption issue is perhaps even worse than it sounds, as SRAM cells spend most of their operating time in retention mode.

As such, further development into SRAM cell design is commercially desirable in order to produce SRAM cells that have retention voltages no greater than necessary to retain their data contents during retention mode.

SUMMARY

In an embodiment, a static random access memory (SRAM) device includes: an array of SRAM cells powered between a first voltage and a second voltage in retention mode; a reference voltage generator configured to generate a reference voltage that is proportional to absolute temperature, wherein a magnitude curve of the reference voltage as a function of temperature is based upon a control word; a circuit configured to set and maintain the second voltage as being equal to the reference voltage; and control circuitry configured to generate the control word based upon information about the SRAM device.

The second voltage may be a virtual ground and the first voltage may be a supply voltage.

The second voltage may be a virtual supply voltage and the first voltage may be ground.

The control circuitry may include: at least one canary bit-cell that is configured to fail in retention mode at a higher retention voltage than the array of SRAM cells, wherein failure in retention mode comprises unintentionally changing state of retained data, and wherein the retention voltage is a difference between the first and second voltages; a failure detector configured to detect an unintentional change in state of the retained data in the at least one canary bit-cell and to generate its output based thereupon; and a controller configured to generate the control word based upon the output of the failure detector.

The controller of the control circuitry may be configured to perform steps of: a) set the control word to a default control word, wherein the reference voltage generator is configured to generate the reference voltage in response to the default control word as having a magnitude curve at which the SRAM device is not expected to fail in retention mode; b) increment the control word to a next control word, wherein the reference voltage generator is configured to generate the reference voltage in response to the next control word as having a magnitude curve at which the SRAM device might fail in retention mode; c) if the output of the failure detector indicates failure, maintain the control word sent to the reference voltage generator at the control word of step b); and d) if the output of the failure detector does not indicate failure of the canary bit-cell, return to step b).

The controller may be configured to perform step a) at each startup of the SRAM device.

The at least one canary bit-cell may include a plurality of canary bit-cells each configured to fail in retention mode at a higher retention voltage than the array of SRAM cells;

wherein the failure detector is configured to detect an unintentional change in state of the retained data in the plurality of canary bit-cells and to generate its output based thereupon.

The control circuitry may include: an SRAM process monitoring circuit configured to operate in a fashion that tracks the array of SRAM cells across process variations; and a process information decoder configured to generate the control word based upon operation of the SRAM process monitoring circuit.

The reference voltage may track with temperature to secure data within the array of SRAM cells during retention mode and to reduce leakage currents within the array of SRAM cells.

The reference voltage generator may include: a current generator configured to generate a current proportional to absolute temperature having a magnitude curve based upon the control word; and a resistor coupled between the current generator and ground, wherein the reference voltage is formed across the resistor.

The reference voltage generator may include: a plurality of reference voltage generators each configured to generate a reference voltage that is proportional to absolute temperature, wherein the reference voltages generated by each of the plurality of reference voltage generators have different magnitude curves from one another; and a multiplexer configured to pass the reference voltage generated by one of the plurality of reference voltage generators to the circuit configured to set and maintain the second voltage as being equal to the reference voltage, wherein the control word defines which one of the plurality of reference voltage generators is to have its reference voltage passed by the multiplexer.

The circuit configured to set and maintain the second voltage as being equal to the reference voltage may be a low dropout amplifier.

A method of operating a static random access memory (SRAM) device in retention mode may include: powering an array of SRAM cells powered between first and second voltages in retention mode; detecting process variation information about the array of SRAM cells, and generating a control word based thereupon; generating a reference voltage that is proportional to absolute temperature and having a magnitude curve that is set by the control word; and maintaining the second voltage as being equal to the reference voltage.

Generating the control word may include steps of: a) setting the control word to a default control word, wherein the reference voltage is generated in response to the default control word as having a magnitude curve at which the array of SRAM cells is not expected to fail in retention mode; b) incrementing the control word to a next control word, wherein the reference voltage is generated in response to the next control word as having a magnitude curve at which the array of SRAM cells might fail in retention mode; c) if failure of a canary bit-cell occurs, maintain the control word of step b); and d) if failure of the canary bit-cell occurs, return to step b).

The method may also include performing step a) at each startup of the SRAM device.

The detecting of the process variation information may include: operating a ring oscillator formed on a same die as the array of SRAM cells; detecting an oscillation frequency of the ring oscillator; and determining the process variation information based upon the oscillation frequency of the ring oscillator.

Generating the reference voltage may include: generating a current proportional to absolute temperature having a magnitude curve that is set by the control word; and sourcing the current proportional to absolute temperature to a resistor so that the reference voltage will be formed thereacross.

Generating the reference voltage may include: selecting one of a plurality of reference voltages each being proportional to absolute temperature and having different magnitude curves from one another, based upon the control word; and passing the selected reference voltage for use as the reference voltage.

In an embodiment, a device includes: an array of memory cells powered between a first voltage and a second; a reference voltage generator configured to generate a reference voltage that is proportional to absolute temperature, responsive to a control word; a circuit configured to set and maintain the second voltage as being equal to the reference voltage; and control circuitry configured to generate the control word. The control circuitry includes: at least one canary bit-cell that is configured to fail at a higher voltage than the array of SRAM cells, wherein failure comprises unintentionally changing state of retained data; a failure detector configured to detect an unintentional change in state of the retained data in the at least one canary bit-cell and to generate its output based thereupon; and a controller configured to generate the control word based upon the output of the failure detector.

The at least one canary bit-cell may include a plurality of canary bit-cells each configured to fail at a higher retention voltage than the array of SRAM cells, and the failure detector may be configured to detect an unintentional change in state of the retained data in the plurality of canary bit-cells and to generate its output based thereupon.

The controller of the control circuitry may be configured to perform steps of: a) setting the control word to a default control word; b) incrementing the control word to a next control word; c) if the output of the failure detector indicates failure, maintaining the control word sent to the reference voltage generator at the control word of step b); and d) if the output of the failure detector does not indicate failure of the canary bit-cell, returning to step b).

In one instance, the second voltage may be a virtual ground and the first voltage may be a supply voltage.

In another instance, the second voltage may be a virtual supply voltage and the first voltage may be ground.

The circuit configured to set and maintain the second voltage as being equal to the reference voltage may be a low dropout amplifier.

The reference voltage generator may include: a current generator configured to generate a current proportional to absolute temperature having a magnitude curve based upon the control word; and a resistor coupled between the current generator and ground, wherein the reference voltage is formed across the resistor.

The reference voltage generator may include: a plurality of reference voltage generators each configured to generate a reference voltage that is proportional to absolute temperature, wherein the reference voltages generated by each of the plurality of reference voltage generators have different magnitude curves from one another; and a multiplexer configured to pass the reference voltage generated by one of the plurality of reference voltage generators to the circuit configured to set and maintain the second voltage as being equal to the reference voltage, wherein the control word defines which one of the plurality of reference voltage generators is to have its reference voltage passed by the multiplexer.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
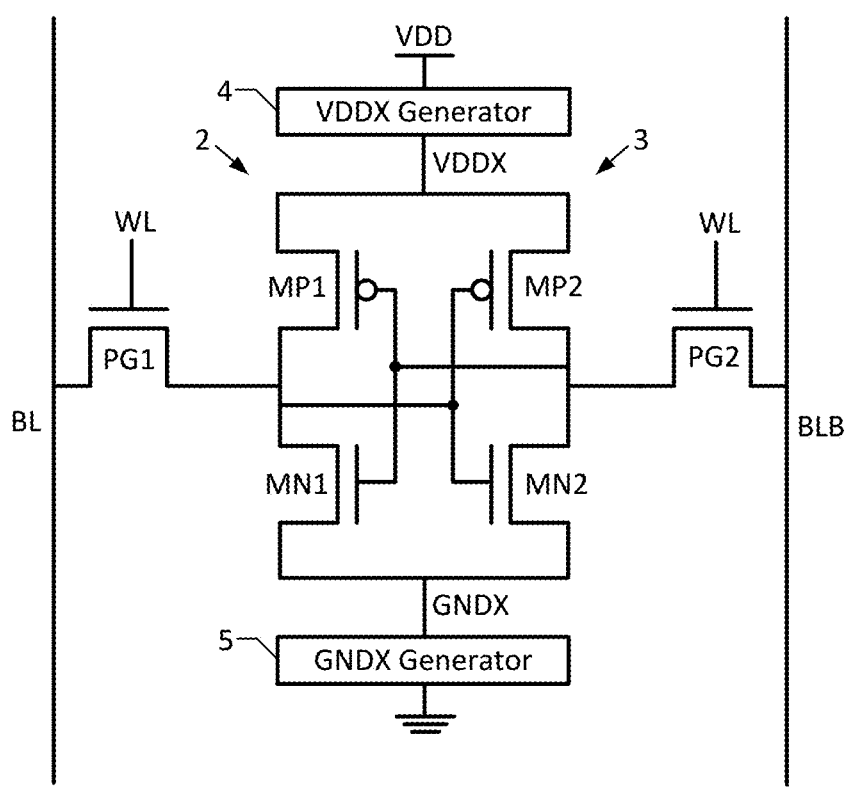
FIG. 1 is a schematic block diagram of a prior art SRAM cell.
Figure 2A:
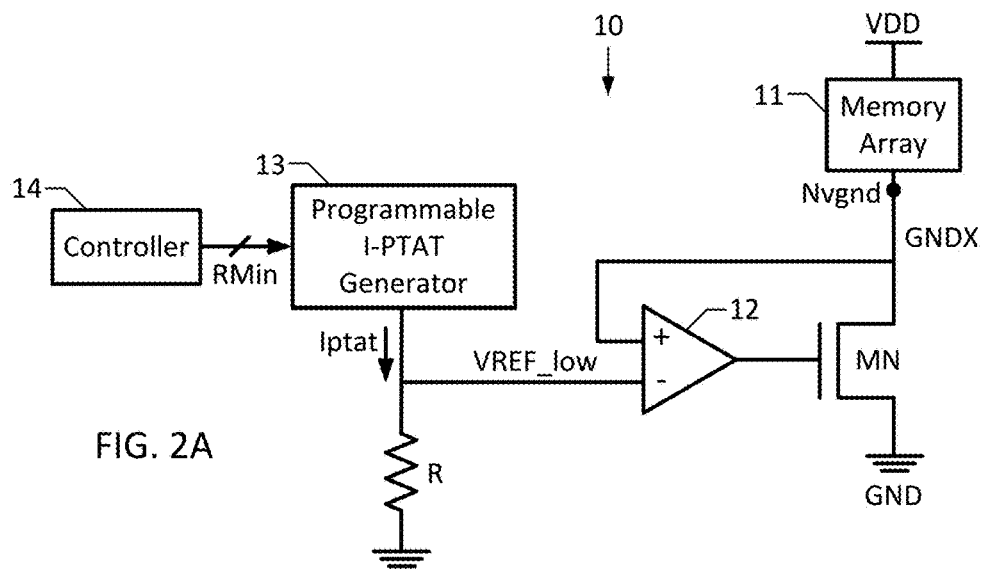
FIG. 2A is a schematic block diagram of an SRAM array disclosed herein including circuitry for adjusting the retention voltage (by adjusting the SRAM ground voltage) so as to reduce power consumption.

Now described with initial reference to FIG. 2A is an SRAM array 10 that includes a memory array 11 powered between a supply voltage VDD and a settable SRAM ground voltage GNDX. Since the SRAM ground voltage GNDX is settable, it can be considered to be a "virtual" or "floating" ground voltage, and may also be referred to as the SRAM source voltage.

The memory array 11 is an array of SRAM cells, for example having the standard 6-transistor layout of a pair of cross-coupled CMOS inverters with a respective pair of pass gate transistors selectively connecting the outputs of the cross coupled inverters to a bit line and a complementary bit line. Note, however, that the SRAM cells of the memory array 11 may have any suitable SRAM structure, and are not limited to the 6-transistor design.

The settable SRAM ground voltage GNDX is set by a low dropout amplifier (LDO) arrangement that maintains the SRAM ground voltage GNDX as being equal to a set reference voltage VREF_low; this LDO arrangement is formed by an amplifier 12 (e.g., an operational amplifier) having its non-inverting terminal coupled to the virtual ground node Nvgnd of the memory array 11, its inverting terminal coupled to the settable reference voltage VREF_low, and its output coupled to the gate of an n-channel transistor MN that has its drain coupled to the virtual ground node Nvgnd of the memory array 11 and its source coupled to ground. By "virtual ground node", the node connected to the sources of the n-channel transistors of the SRAM cells within the memory array 11 is meant, as will be appreciated by those of skill in the art.

The reference voltage VREF_low is set by a programmable current generator 13 that generates a current proportional to absolute temperature Iptat having a slope that is proportional to absolute temperature, and the magnitude of the current-to-temperature curve of Iptat (which can be referred to as the magnitude curve of Iptat) is settable by minimum retention voltage control bits RMin received from a controller 14. In particular, by the magnitude curve of Iptat being set, it is meant that the entire curve is shifted upward or downward while the slope may or may not remain the same. This Iptat current flowing through resistor R generates the reference voltage VREF_low at the inverting terminal of the amplifier 12, and, as explained, the amplifier 12 maintains GNDX at its output as being equal to VREF_low. Therefore, the control bits RMin can be considered to set the magnitude of the voltage-to-temperature curve of GNDX, which can be referred to as the magnitude curve of GNDX. By the magnitude curve of GNDX being set, it is meant that the entire curve is shifted upward or downward, while the slope may or may not remain the same.

The controller 14 generates the control bits RMin based upon known conditions of the SRAM array 10 (the determination of which will be described below), so that VREF_low produces the maximum value of GNDX at which the retention voltage (VDD-GNDX, for the current operating temperature) across the memory array 11 is sufficient to maintain the data stored thereby. The effect of changing the control bits RMin on the magnitude curve of GNDX can be seen in FIG. 3. For example, changing the control bits RMin can change GNDX from following the P2 magnitude curve to instead following the P1 magnitude curve. The reason that these curves are set to be proportional to absolute temperature is that it has been found that as operating temperature increases, the minimum retention voltage (VDD-GNDX) at which data is properly retained by the memory array 11 lowers. Therefore, by increasing GNDX with temperature, the minimum requisite retention voltage for the current operating temperature is obtained and maintained. As an example, for a certain tested memory type, it has been found that the minimum retention voltage at −40° C. is 0.77 V, at 25° C. is 0.74 V, and at 125° C. is 0.71 V.

Figure 3:
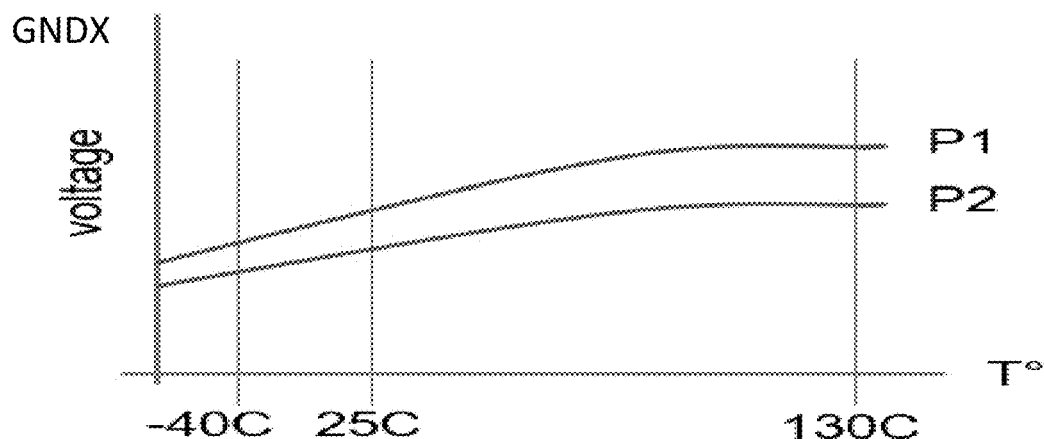
FIG. 3 is a graph showing the SRAM ground voltage as generated and used by the SRAM array of FIG. 2A over a range of temperatures and at two different settings.

As stated, the programmable current generator 13 is capable of generating Iptat as having multiple different magnitude curves, and which of these magnitude curves Iptat has is dependent upon the control bits RMin last received. In some instances, the number of selectable magnitude curves for Iptat may be equal to the number of states representable by the control bits of RMin. For example, if there is one control bit RMin, then there may be two Iptat magnitude curves to select from among, ultimately resulting in two curves P1 and P2 for GNDX as shown in FIG. 3. In other instances, the number of selectable magnitude curves for Iptat may be less than the number of states representable by the control bits of RMin—for example, RMin may be two bits, but there may be three selectable magnitude curves for Iptat, despite the fact that two bits can represent four numbers (00, 01, 10, and 11 in binary).

Figure 2B:
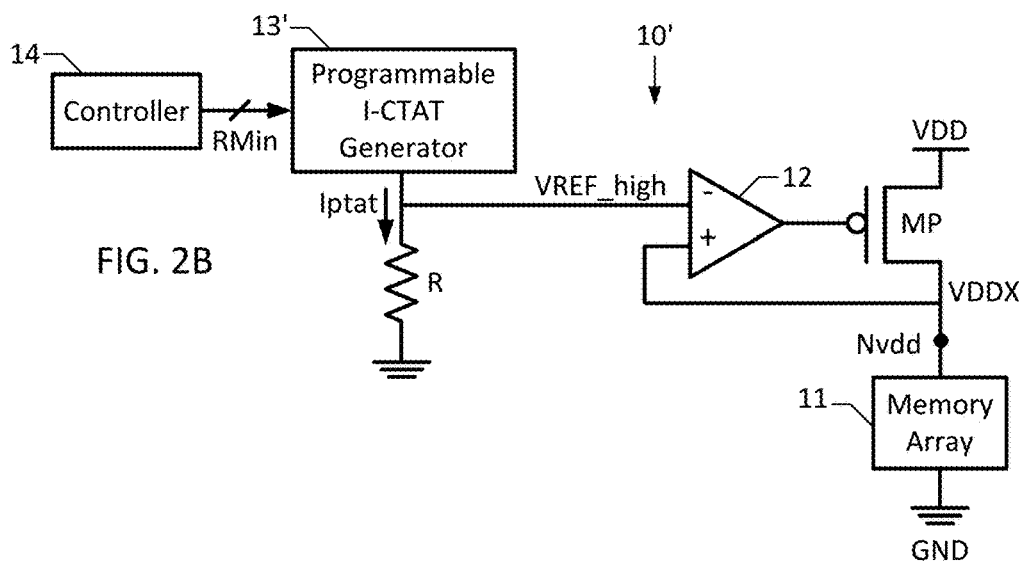
FIG. 2B is a schematic block diagram of an SRAM array disclosed herein including circuitry for adjusting the retention voltage (by adjusting the SRAM supply voltage) so as to reduce power consumption.

Instead of the SRAM array 10 being powered between the supply voltage VDD and the SRAM ground voltage GNDX, it may instead be powered between an SRAM supply voltage VDDX (e.g., a virtual supply voltage) and ground. This arrangement is shown in FIG. 2B, where the SRAM array 10' illustrated is powered between the SRAM supply voltage VDDX and ground. The SRAM supply voltage VDDX is set by an LDO arrangement that maintains VDDX as being equal to VREF_high, the LDO arrangement being formed by the amplifier 12 (e.g., an operational amplifier) having its non-inverting terminal coupled to the virtual supply node Nvdd of the memory array 11, its inverting terminal coupled to the settable reference voltage VREF_high, and its output coupled to the gate of a p-channel transistor MP. The p-channel transistor MP has its source coupled to VDD, its drain coupled to the virtual supply node Nvdd of the memory array 11, and its gate coupled to the output of the amplifier 12. By "virtual supply node", the node connecting the sources of the p-channel transistors of the SRAM cells within the memory array 11 is meant, as will be appreciated by those of skill in the art.

The reference voltage VREF_high for the SRAM array 10', and therefore the SRAM supply voltage VDDX, is set by the −Ictat current generated by the programmable current generator 13' and flowing through resistor R, and the magnitude curve of the Ictat current is set by control bits RMin received from the controller 14 as explained above with reference to FIG. 2A. Although not shown, the potential magnitude curves for VDDX appear as inverted versions of the curves of GNDX that are shown in FIG. 3, and therefore decrease linearly over temperature because, as described, as operating temperature increases, the minimum retention voltage (here, VDDX-GND) at which data is properly retained by the memory array 11 lowers.

Embodiments in which the controller 14 is described will now be described. Refer to the SRAM array 20 of FIG. 4A, where it can be seen that the difference as compared to FIG. 2A is that the controller 24 is shown in detail. Here, the controller 24 includes a canary bit-cell 25 connected between VDD and GNDX that provides output to a failure detector 26. The canary bit-cell 25 is a dummy SRAM cell purposely designed to be imbalanced such that its minimum retention voltage (VDD-GNDX) will be slightly higher than that of the SRAM cells of the memory array 11. Note that the canary bit-cell 25 is formed on the same die (e.g., chip) as the memory array 11, and may be physically located immediately adjacent to the memory 11 on the die, and therefore tracks the memory array 11 across process variation. The failure detector 26 detects when the state of the canary bit-cell 25 has changed, which indicates that the data contained thereby has been lost, and in response thereto, generates a failure output signal Fout to be received by a digital controller 27.

Figure 5:
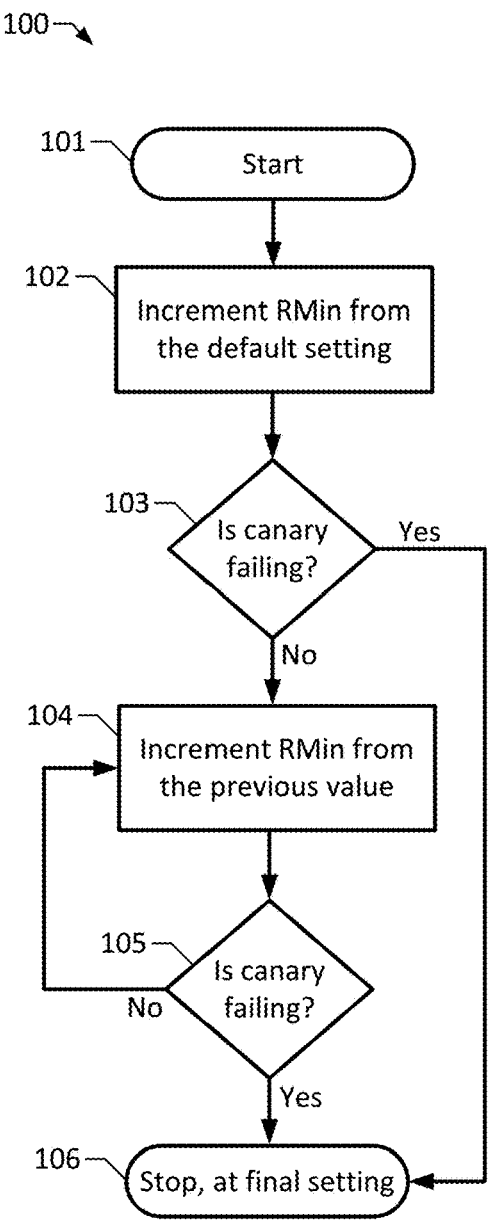
FIG. 5 is a flowchart illustrating the operation of the digital controller of FIGS. 4A-4B.
Figure 6:
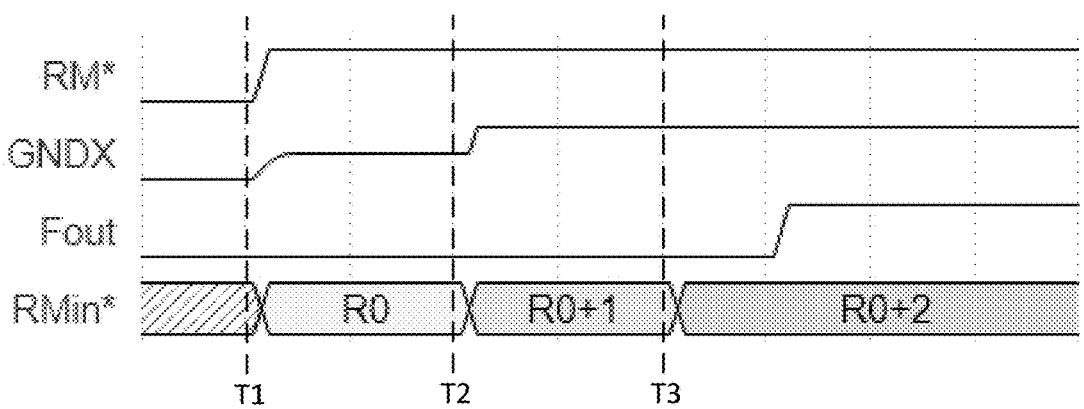
FIG. 6 is a timing diagram showing operation of the SRAM array of FIG. 4A.

The operation of the controller 24 is now described with additional reference to FIGS. 5-6 for performing configuration at electronic wafer sort (EWS) utilizing the canary bit cell and related circuitry. This is performed on each die to decide the proper RMin value for that lot. This way, the worst case design approach by which the virtual ground GNDX or virtual supply voltage VDDS are set for the worst case is avoided, as each lot is tuned for process, while maintaining a suitable margin to accommodate for statistical variation on each specific die. Note that in some instanced, this configuration may also be performed at regular intervals, such as at each power-on, so as to track aging related drift.

Referring to the flowchart 100 of FIG. 5, the controller 24 operates in a calibration phase that begins (see Block 101, the start), for example, at power-on. At power-on (time T1 in FIG. 5), the control bits RMin are set by the digital controller 27 to a default value stored in a lookup table. The default value of RMin is such that the magnitude curve of the current Iptat output by the programmable current generator 13 results in GNDX having a magnitude curve sufficiently low in voltage across temperature such that even at the worst corner of a poor performing lot of SRAM die, regardless of operating temperature, the retention voltage (VDD-GNDX) will be sufficient for proper operation.

Then, at time T2, the control bits RMin are incremented by the digital controller 27 to a next value stored in the lookup table (Block 102). For example, the default RMin control bits may be a binary 00, and the first incrementing at Block 102 causes the RMin control bits to be incremented to a binary 01. The programmable current generator 13, in response to the incremented RMin control bits, increments the magnitude curve of Iptat from the default value, resulting in the magnitude curve of GNDX being produced as being shifted upwardly compared to the default (meaning that, for a given temperature, GNDX resulting from the incremented RMin control bits is greater than GNDX resulting from the default RMin control bits). As can be seen between times T2 and T3 in FIG. 6, the value of GNDX is therefore greater than between times T1 and T2, meaning that the retention voltage (VDD-GNDX) has been reduced.

If the state of the canary bit-cell does not change, the failure detector 26 does not assert the failure output signal Fout (Block 103). As can be seen in the example of FIG. 6, the failure output signal Fout remains at a logic low between times T2 and T3. Therefore, it can be assumed that the memory array 11 can function properly with the current magnitude curve of GNDX, and that the current retention voltage (VDD-GNDX) is sufficient.

The digital controller 27 then increments the control bits RMin again (Block 104) to a next value stored in the lookup table. This, as explained, results in the programmable current generator 13 incrementing the magnitude curve of Iptat from the previous value, resulting in the magnitude curve of GNDX being produced as being shifted upwardly compared to its previous setting. As can be seen after time T3, the value of GNDX is greater than between times T2 and T3. If the state of the canary bit-cell changes, the failure detector 26 asserts the failure output signal Fout. As can be seen in FIG. 6, after time T3, the failure output signal Fout is asserted, meaning that the state of the canary bit-cell has changed.

Therefore, the canary bit-cell has failed (Block 105), and the digital controller 27 has reached the final setting for the control bits RMin (Block 106)—keep in mind that the canary bit-cell is specifically designed to be unbalanced so that it fails before the worst off SRAM cell of the memory array 11 fails, and the selectable magnitude curves of Iptat are set such at that the first magnitude curve of Iptat (when incrementing through the curves) at which the canary bit-cell 25 fails, the retention voltage (VDD-GNDX) will be sufficient for the memory array 11 to retain data without loss.

Figure 4A:
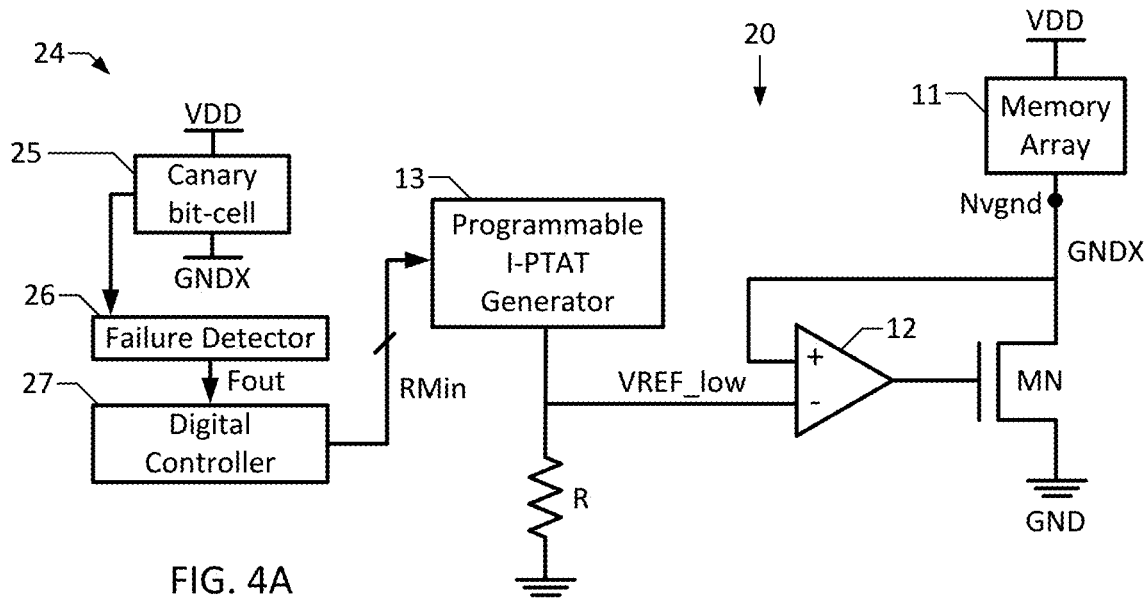
FIG. 4A is a schematic block diagram of an SRAM array disclosed herein including circuitry for adjusting the retention voltage (by utilizing a canary bit-cell to determine the appropriate SRAM ground voltage based on process) so as to reduce power consumption.
Figure 4B:
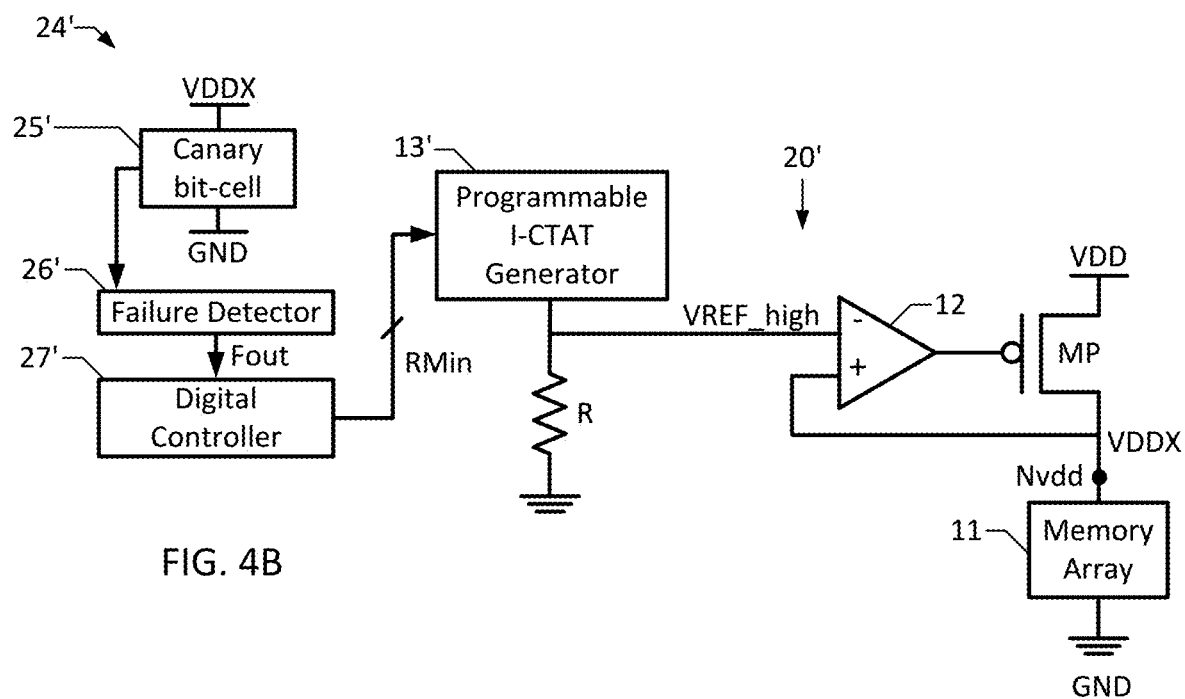
FIG. 4B is a schematic block diagram of an SRAM array disclosed herein including circuitry for adjusting the retention voltage (by utilizing a canary bit-cell to determine the appropriate SRAM supply voltage based on process) so as to reduce power consumption.

Instead of the SRAM array 20 being powered between the supply voltage VDD and the SRAM ground voltage GNDX, it may instead be powered between an SRAM supply voltage VDDX (e.g., a virtual supply voltage) and ground. This arrangement is shown in FIG. 4B, where the SRAM array 20' illustrated is powered between the SRAM supply voltage VDDX and ground. The SRAM supply voltage VDDX is set by an LDO arrangement that maintains VDDX as being equal to VREF_high, the LDO arrangement being formed by the amplifier 12 (e.g., an operational amplifier) having its non-inverting terminal coupled to the virtual supply node Nvdd of the memory array 11, its inverting terminal coupled to the settable reference voltage VREF_high, and its output coupled to the gate of a p-channel transistor MP. The p-channel transistor MP has its source coupled to VDD, its drain coupled to the virtual supply node Nvdd of the memory array 11, and its gate coupled to the output of the amplifier 12. By "virtual supply node", the node connecting the sources of the p-channel transistors of the SRAM cells within the memory array 11 is meant, as will be appreciated by those of skill in the art.

The reference voltage VREF_high for the SRAM array 20', and therefore the SRAM supply voltage VDDX, is set by the Ictat current generated by the programmable current generator 13' and flowing through resistor R, and the magnitude curve of the Ictat current is set by control bits RMin received from the controller 24' as explained above in detail, except the magnitude curve of VDDX is shifted downwardly with each incrementing of RMin instead of being shifted upwardly. Note that here, the canary bit-cell 25' is powered between VDDX and ground.

Figure 7A:
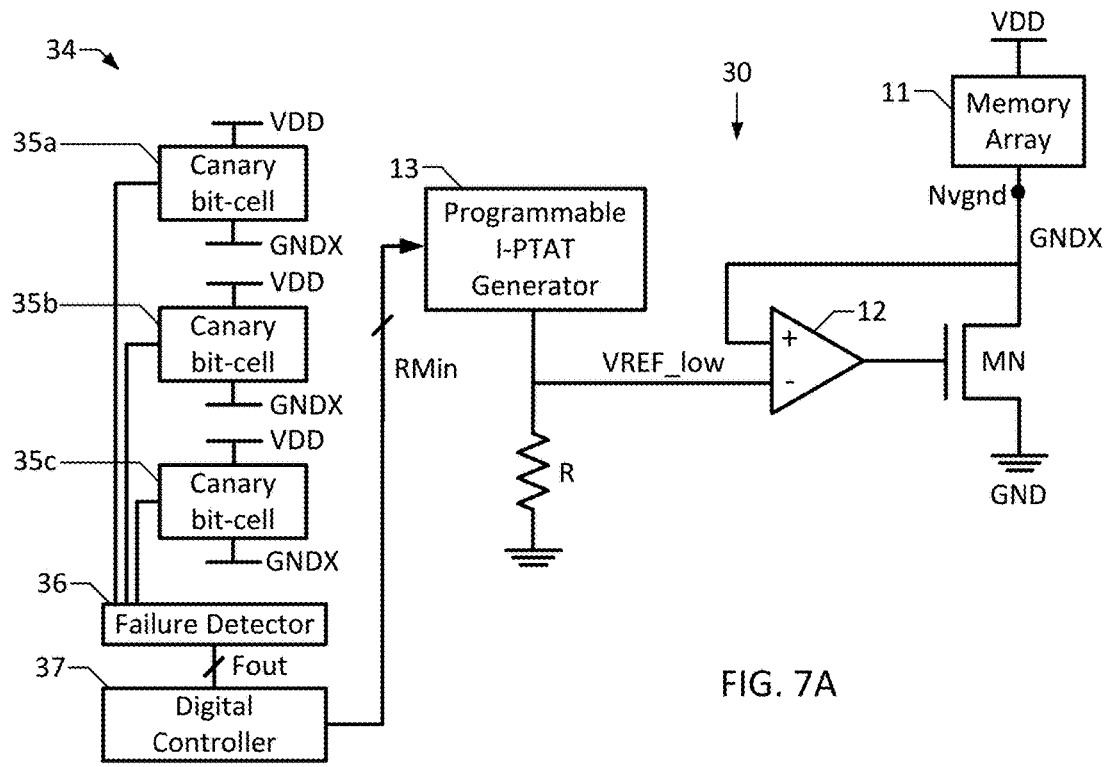
FIG. 7A is a schematic block diagram of an SRAM array disclosed herein including circuitry for adjusting the retention voltage (by utilizing multiple different canary bit-cells to more precisely determine the appropriate SRAM ground voltage based on process) so as to reduce power consumption.

Appreciate that instead of one canary bit-cell 25, there may instead be multiple canary bit-cells. Such an embodiment is shown in FIG. 7A, where it can be seen that the difference as compared to FIG. 4A is that the controller 24 contains multiple canary bit-cells 35a-35c. Each of the canary bit-cells 35a-35c is purposely designed to be imbalanced such that its minimum retention voltage (VDD-GNDX) will be higher than that of the SRAM cells of the memory array 11.

In some instances, each of the canary bit-cells 35a-35c is purposely designed such that its imbalance is different from the other canary bit-cells 35a-35c. For example, the canary bit-cell 35a can be designed such that its minimum retention voltage (VDD-GNDX) will be a first amount higher than that of the SRAM cells of the memory array 11, the canary bit-cell 35b such that its minimum retention voltage (VDD-GNDX) will be a second amount higher than that of the SRAM cells of the memory array 11, and the canary bit-cell 35c such that its minimum retention voltage (VDD-GNDX) will be a third amount higher than that of the SRAM cells of the memory array 11, with the third amount being less than the second amount, and the second amount being less than the first amount.

In other instances, each of the canary bit-cells 35a-35c may have the same imbalance as one another.

The failure detector 36 monitors the states of each canary bit-cell 35a-35c, and generates the failure output signal Fout as having a number of bits capable of representing the number of canary-bit cells present (since any number of canary bit-cells may be present). Here, the failure output signal Fout is a two bit signal, since there are three canary bit-cells 35a-35c.

The digital controller 37 may operate as the digital controller 27 described above, by setting the control bits RMin at a default value at startup, and then incrementing the control bits RMin while monitoring the failure output signal Fout. The digital controller 37 may, for example, increment the control bits RMin until two out of three of the canary bit-cells 35a-35c has failed, or until one out of the three of the canary bit-cells 35a-35c has failed.

Figure 7B:
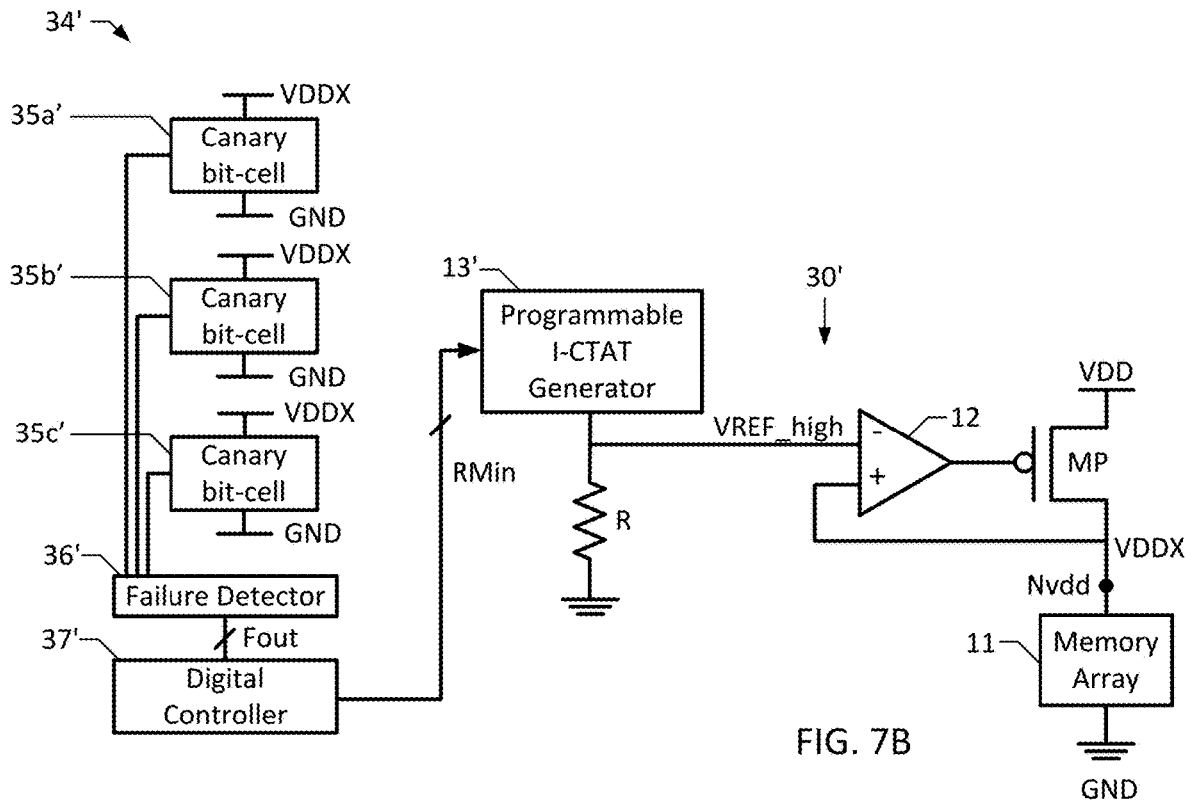
FIG. 7B is a schematic block diagram of an SRAM array disclosed herein including circuitry for adjusting the retention voltage (by utilizing multiple different canary bit-cells to more precisely determine the appropriate SRAM supply voltage base on process) so as to reduce power consumption.

Instead of the SRAM array 30 being powered between the supply voltage VDD and the SRAM ground voltage GNDX, it may instead be powered between an SRAM supply voltage VDDX (e.g., a virtual supply voltage) and ground. This arrangement is shown in FIG. 7B, where the SRAM array 30' illustrated is powered between the SRAM supply voltage VDDX and ground. The SRAM supply voltage VDDX is set by an LDO arrangement that maintains VDDX as being equal to VREF_high, the LDO arrangement being formed by the amplifier 12 (e.g., an operational amplifier) having its non-inverting terminal coupled to the virtual supply node Nvdd of the memory array 11, its inverting terminal coupled to the settable reference voltage VREF_high, and its output coupled to the gate of a p-channel transistor MP. The p-channel transistor MP has its source coupled to VDD, its drain coupled to the virtual supply node Nvdd of the memory array 11, and its gate coupled to the output of the amplifier 12. By "virtual supply node", the node connecting the sources of the p-channel transistors of the SRAM cells within the memory array 11 is meant, as will be appreciated by those of skill in the art.

The reference voltage VREF_high for the SRAM array 30', and therefore the SRAM supply voltage VDDX, is set by the Ictat current generated by the programmable current generator 13' and flowing through resistor R, and the magnitude curve of the Ictat current is set by control bits RMin received from the controller 34' as explained above in detail. Note that here, the canary bit-cells 35' are powered between VDDX and ground.

Figure 8A:
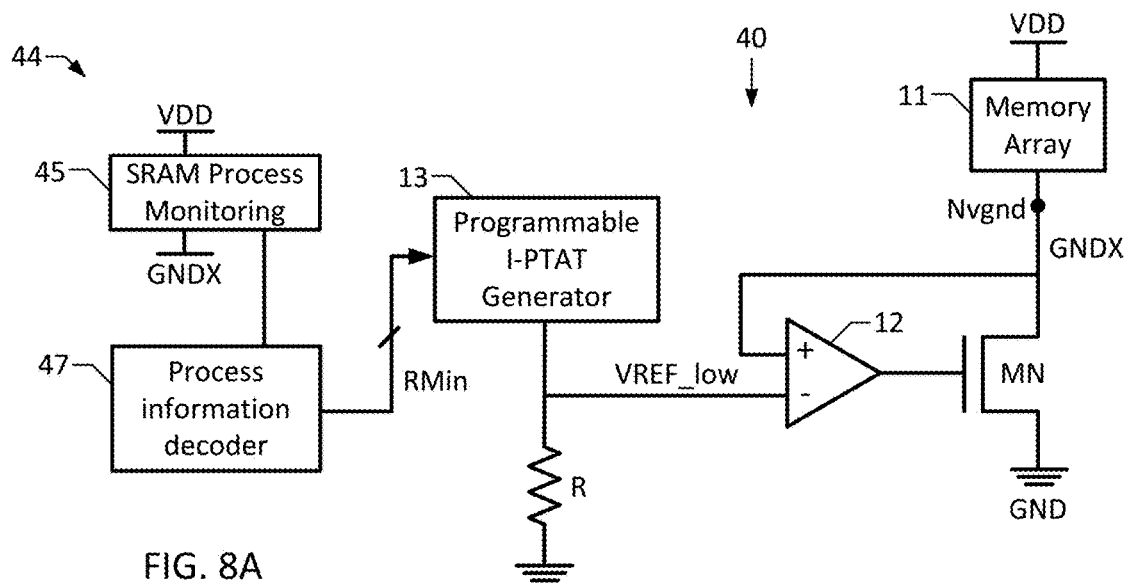
FIG. 8A is a schematic block diagram of an SRAM array disclosed herein including circuitry for adjusting the retention voltage (by utilizing an SRAM process monitoring array to determine the appropriate SRAM ground voltage based on process) so as to reduce power consumption.

Another alternate configuration for the controller 14 that does not involve canary bit-cells is now described with reference to FIG. 8A. In this example of the SRAM memory 40, the controller 44 is comprised of an SRAM process monitoring circuit 45 powered between the supply voltage VDD and the SRAM ground voltage GNDX, and a process information decoder 47 receiving output from the SRAM process monitoring circuit 45.

The SRAM process monitoring circuit 45 is a circuit whose performance tracks that of the memory array 11 over process variation. Therefore, the SRAM process monitoring circuit 45 is on the same die as the memory array 11, and may be located immediately adjacent thereto. A process information decoder 47 detects the performance of the SRAM process monitoring circuit 45, and based thereupon, generates the RMin bits. The process information decoder 47 may be located on the same die as the SRAM process monitoring circuit 45 and memory array 11, but may in some instances instead be located in a test fixture utilized at the time of manufacture.

As an example, the SRAM process monitoring circuit 45 may be a ring oscillator, the specific frequency of which is indicative of the condition of the die (e.g., low performing meaning that a higher retention voltage is needed as compared to an average performing or high performing die in order to prevent data loss in retention mode, average performing meaning that a higher retention voltage is needed as compared to a high performing die but is lower than the retention voltage needed by a low performing die, or high performing meaning that a lower retention voltage is needed as compared to low performing and average performing die); the lower the frequency, the lower the performance of the die. Therefore, in this instance where the SRAM process monitoring circuit 45 is a ring oscillator, the process information decoder 47 may be a counter that detects the frequency of the ring oscillator SRAM process monitoring circuit 45, and selects the proper RMin bits (that maintain minimum retention voltage in retention mode without data failure) from a lookup table based upon the detected frequency.

Figure 8B:
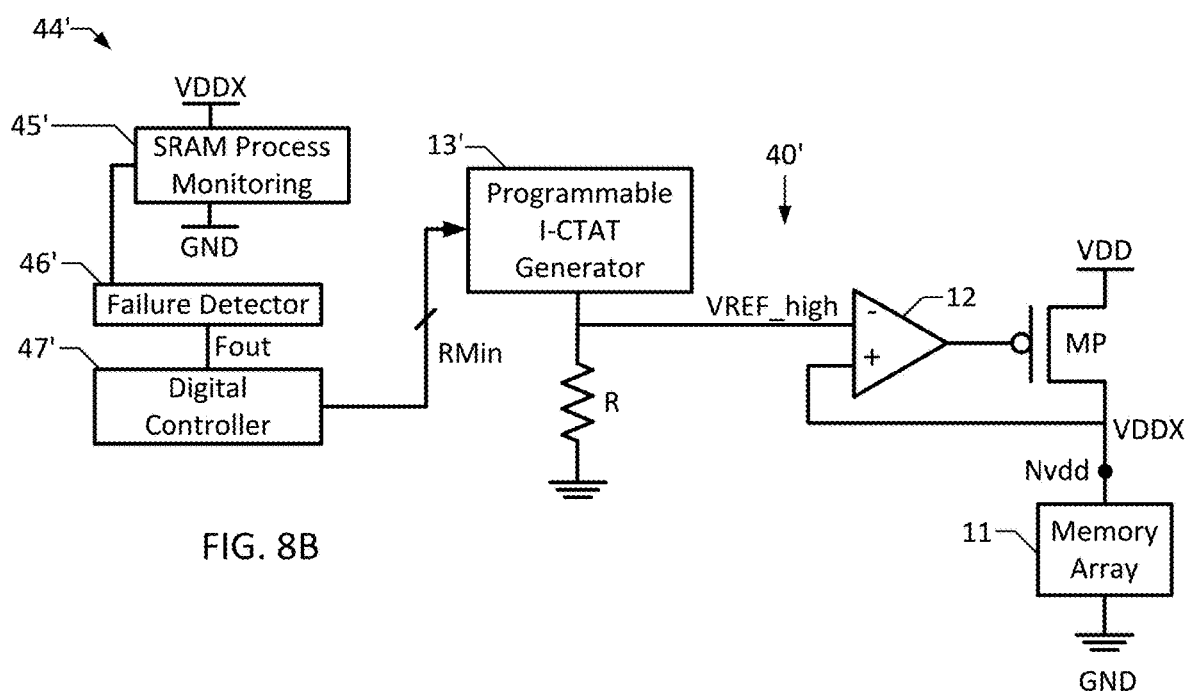
FIG. 8B is a schematic block diagram of an SRAM array disclosed herein including circuitry for adjusting the retention voltage (by utilizing an SRAM process monitoring array to determine the appropriate SRAM supply voltage based on process) so as to reduce power consumption.

Instead of the SRAM array 40 being powered between the supply voltage VDD and the SRAM ground voltage GNDX, it may instead be powered between an SRAM supply voltage VDDX (e.g., a virtual supply voltage) and ground. This arrangement is shown in FIG. 8B, where the SRAM array 40' illustrated is powered between the SRAM supply voltage VDDX and ground. The SRAM supply voltage VDDX is set by an LDO arrangement that maintains VDDX as being equal to VREF_high, the LDO arrangement being formed by the amplifier 12 (e.g., an operational amplifier) having its non-inverting terminal coupled to the virtual supply node Nvdd of the memory array 11, its inverting terminal coupled to the settable reference voltage VREF_high, and its output coupled to the gate of a p-channel transistor MP. The p-channel transistor MP has its source coupled to VDD, its drain coupled to the virtual supply node Nvdd of the memory array 11, and its gate coupled to the output of the amplifier 12. By "virtual supply node", the node connecting the sources of the p-channel transistors of the SRAM cells within the memory array 11 is meant, as will be appreciated by those of skill in the art.

The reference voltage VREF_high for the SRAM array 40', and therefore the SRAM supply voltage VDDX, is set by a current complementary to absolute temperature Ictat current generated by the programmable current generator 13' and flowing through resistor R, and the magnitude curve of the Ictat current is set by control bits RMin received from the controller 44' as explained above in detail. Note that here, the SRAM processing circuit 45' is powered between VDDX and ground.

Figure 9A:
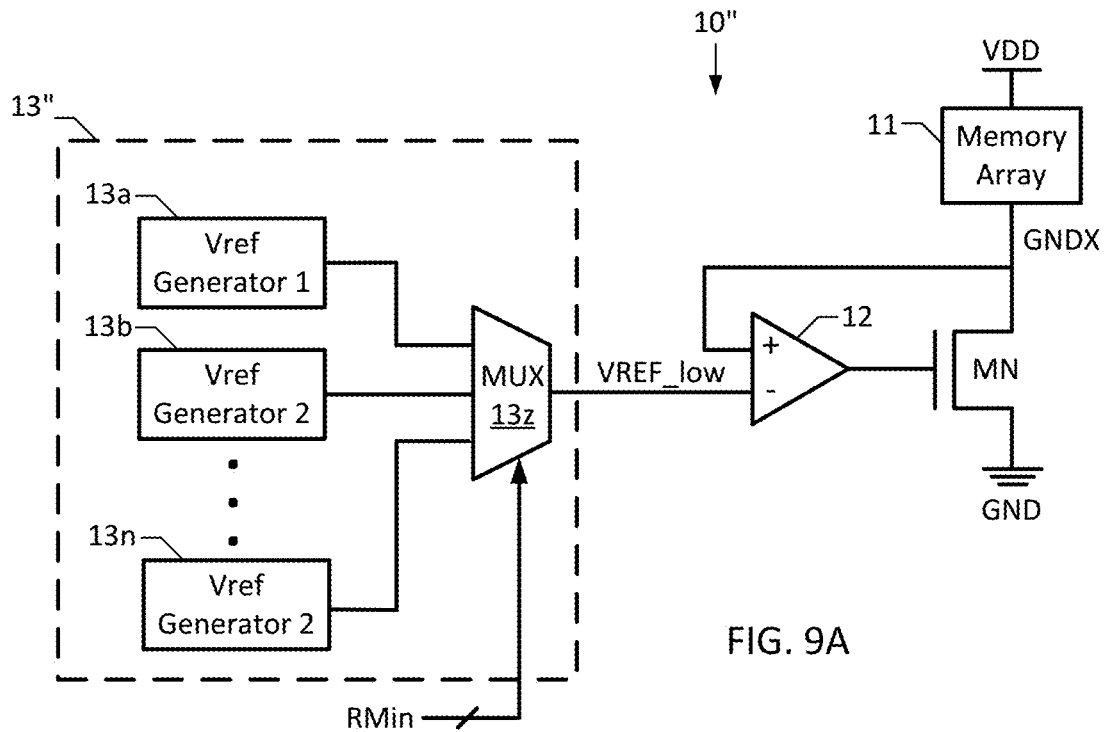
FIG. 9A is a schematic block diagram of an SRAM array disclosed herein in which a multiplexer passes a reference voltage from one of multiple different reference voltage generators for use as an SRAM ground voltage.

Shown in the SRAM array 10" of FIG. 9A is an example where the controller 44 is not shown (and may take the form of any disclosed herein), and where instead of a programmable current generator, there is a programmable voltage generator 13" that generates VREF_low as being proportional to absolute temperature. The programmable current generator 13" is comprised of a number n of reference voltage generators 13a-13n that generate different reference voltages that are each proportional to absolute temperature. Each reference voltage so generated has the same (or similar but not identical) voltage-to-temperature slope, but has a different magnitude curve from one another. Therefore, for example, the voltage-to-temperature curve produced by the reference voltage generator 13a may be generally the same as that produced by the reference voltage generator 13b, but shifted upward, and the voltage-to-temperature curve produced by the reference voltage generator 13n may be generally the same as that produced by the reference voltage generator 13b, but shifted upward.

In operation, the multiplexer 13z accepts the RMin bits as input, and passes the voltage from one of the reference voltage generators 13a-13n as the reference voltage VREF_low fed to the inverting input of the amplifier 12.

Figure 9B:
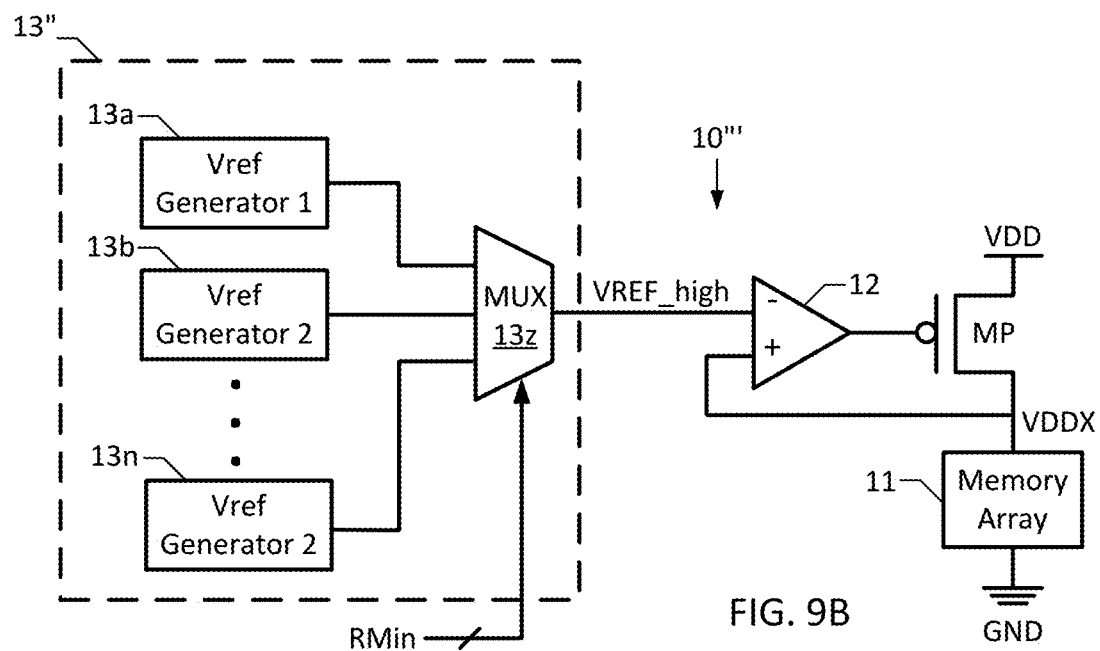
FIG. 9B is a schematic block diagram of an SRAM array disclosed herein in which a multiplexer passes a reference voltage from one of multiple different reference voltage generators for use as an SRAM supply voltage.

Instead of the SRAM array 10" being powered between the supply voltage VDD and the SRAM ground voltage GNDX, it may instead be powered between an SRAM supply voltage VDDX (e.g., a virtual supply voltage) and ground. This arrangement is shown in FIG. 9B, where the SRAM array 10''' illustrated is powered between the SRAM supply voltage VDDX and ground. The SRAM supply voltage VDDX is set by an LDO arrangement that maintains VDDX as being equal to VREF_high, the LDO arrangement being formed by the amplifier 12 (e.g., an operational amplifier) having its non-inverting terminal coupled to the virtual supply node Nvdd of the memory array 11, its inverting terminal coupled to the settable reference voltage VREF_high, and its output coupled to the gate of a p-channel transistor MP. The p-channel transistor MP has its source coupled to VDD, its drain coupled to the virtual supply node Nvdd of the memory array 11, and its gate coupled to the output of the amplifier 12. By "virtual supply node", the node connecting the sources of the p-channel transistors of the SRAM cells within the memory array 11 is meant, as will be appreciated by those of skill in the art.

The reference voltage VREF_high for the SRAM array 10''', and therefore the SRAM supply voltage VDDX, is set by the multiplexer 13z selecting output from one of the reference voltage generators 13a-13n to pass, based upon the RMin bits.

In the above examples, the calibration (where RMin is determined, and GNDX or VDDX is set) is performed once per power-up of the device (or at electrical wafer sorting, EWS). This therefore facilitates adjustment of the retention voltage (VDD-GNDX, or VDDX-GND) over time, which can be useful as the performance of SRAM cells may change with age, and as the voltages actually produced by the LDO in response to different RMin bits may change with age.

However, it should be appreciated that the calibration may be performed only once during a manufacturing step, with the RMin bits remaining unchanging at subsequent power-ups of the device. It should also be appreciated that the calibration may instead be performed periodically during operation of the device, or may instead be performed every given number of power-ups of the device (for example, once every 10 power-ups).

In the above examples (FIGS. 2A, 2B; 4A, 4B; 7A, 7B; 8A; 8B; and 9A, 9B), embodiments where GNDX or VDDX (respectively the A and B versions of each example) are generated and adjusted are shown. However, for each example, the two illustrated embodiments may be combined, with the memory array being powered between VDDX and GNDX, and both VDDX and GNDX being adjusted using the techniques and hardware described for each.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A static random access memory (SRAM) device, comprising:
   an array of SRAM cells powered between a first voltage and a second voltage in retention mode, the first voltage being a supply voltage;

a reference voltage generator configured to generate a reference voltage that is proportional to absolute temperature, wherein a magnitude curve of the reference voltage as a function of temperature is based upon a control word;

a circuit configured to set and maintain the second voltage as being equal to the reference voltage such that the second voltage is a virtual ground; and control circuitry configured to generate the control word based upon information about the SRAM device.

2. The SRAM device of claim 1, wherein the control circuitry comprises:

an SRAM process monitoring circuit configured to operate in a fashion that tracks the array of SRAM cells across process variations; and a process information decoder configured to generate the control word based upon operation of the SRAM process monitoring circuit.

3. The SRAM device of claim 1, wherein the reference voltage tracks with temperature to secure data within the array of SRAM cells during retention mode and to reduce leakage currents within the array of SRAM cells.

4. The SRAM device of claim 1, wherein the reference voltage generator comprises:

a plurality of reference voltage generators each configured to generate a reference voltage that is proportional to absolute temperature, wherein the reference voltages generated by each of the plurality of reference voltage generators have different magnitude curves from one another; and a multiplexer configured to pass the reference voltage generated by one of the plurality of reference voltage generators to the circuit configured to set and maintain the second voltage as being equal to the reference voltage, wherein the control word controls selection of the reference voltage from one of the plurality of reference voltage generators to be passed by the multiplexer.

5. The SRAM device of claim 1, wherein the circuit configured to set and maintain the second voltage as being equal to the reference voltage is a low dropout amplifier.

6. A static random access memory (SRAM) device, comprising:

an array of SRAM cells powered between a first voltage and a second voltage in retention mode;

a reference voltage generator configured to generate a reference voltage that is proportional to absolute temperature, wherein a magnitude curve of the reference voltage as a function of temperature is based upon a control word;

a circuit configured to set and maintain the second voltage as being equal to the reference voltage; and control circuitry configured to generate the control word based upon information about the SRAM device;

wherein the control circuitry comprises:

at least one canary bit-cell that is configured to fail in retention mode at a higher retention voltage than the array of SRAM cells, wherein failure in retention mode comprises unintentionally changing state of retained data, and wherein the retention voltage is a difference between the first and second voltages;

a failure detector configured to detect an unintentional change in state of the retained data in the at least one canary bit-cell and to generate an output based thereupon; and a controller configured to generate the control word based upon the output of the failure detector.

7. The SRAM device of claim 6, wherein the controller of the control circuitry is configured to:

a) set the control word to a default control word, wherein the reference voltage generator is configured to generate the reference voltage in response to the default control word as having a magnitude curve at which the SRAM device is not expected to fail in retention mode;

b) increment the control word to a next control word, wherein the reference voltage generator is configured to generate the reference voltage in response to the next control word as having a magnitude curve at which the SRAM device might fail in retention mode;

c) when the output of the failure detector indicates failure, maintain the control word sent to the reference voltage generator at the control word of step b); and d) when the output of the failure detector does not indicate failure of the canary bit-cell, return to step b).

8. The SRAM device of claim 7, wherein the controller is configured to perform step a) at each startup of the SRAM device.

9. The SRAM device of claim 6, wherein the at least one canary bit-cell comprises a plurality of canary bit-cells each configured to fail in retention mode at a higher retention voltage than the array of SRAM cells; and wherein the failure detector is configured to detect an unintentional change in state of the retained data in the plurality of canary bit-cells and to generate the output based thereupon.

10. The SRAM device of claim 6, wherein the first voltage is a supply voltage.

11. A static random access memory (SRAM) device, comprising:

an array of SRAM cells powered between a first voltage and a second voltage in retention mode;

a reference voltage generator configured to generate a reference voltage that is proportional to absolute temperature, wherein a magnitude curve of the reference voltage as a function of temperature is based upon a control word;

a circuit configured to set and maintain the second voltage as being equal to the reference voltage; and control circuitry configured to generate the control word based upon information about the SRAM device;

wherein the reference voltage generator comprises:

a current generator configured to generate a current proportional to absolute temperature having a magnitude curve based upon the control word; and a resistor coupled between the current generator and ground, wherein the reference voltage is formed across the resistor.

12. A device, comprising:

an array of memory cells powered between a first voltage and a second voltage;

a reference voltage generator configured to generate a reference voltage that is proportional to absolute temperature, responsive to a control word;

a circuit configured to set and maintain the second voltage as being equal to the reference voltage; and control circuitry configured to generate the control word;

wherein the control circuitry comprises:

at least one canary bit-cell that is configured to fail at a higher voltage than the array of memory cells, wherein failure comprises unintentionally changing state of retained data;

a failure detector configured to detect an unintentional change in state of the retained data in the at least one canary bit-cell and to generate an output based thereupon; and a controller configured to generate the control word based upon the output of the failure detector.

13. The device of claim 12, wherein the at least one canary bit-cell comprises a plurality of canary bit-cells each configured to fail at a higher retention voltage than the array of SRAM cells; and wherein the failure detector is configured to detect an unintentional change in state of the retained data in the plurality of canary bit-cells and to generate the output based thereupon.

14. The device of claim 12, wherein the controller of the control circuitry is configured to:
   a) set the control word to a default control word;
   b) increment the control word to a next control word;
   c) when the output of the failure detector indicates failure, maintain the control word sent to the reference voltage generator at the control word of step b); and
   d) when the output of the failure detector does not indicate failure of the at least one canary bit-cell, return to step b).

15. The device of claim 12, wherein the second voltage is a virtual ground and the first voltage is a supply voltage.

16. The device of claim 12, wherein the second voltage is a virtual supply voltage and the first voltage is ground.

17. The device of claim 12, wherein the circuit configured to set and maintain the second voltage as being equal to the reference voltage is a low dropout amplifier.

18. The device of claim 12, wherein the reference voltage generator comprises:
   a current generator configured to generate a current proportional to absolute temperature having a magnitude curve based upon the control word; and
   a resistor coupled between the current generator and ground, wherein the reference voltage is formed across the resistor.

19. The device of claim 12, wherein the reference voltage generator comprises:
   a plurality of reference voltage generators each configured to generate a reference voltage that is proportional to absolute temperature, wherein the reference voltages generated by each of the plurality of reference voltage generators have different magnitude curves from one another; and
   a multiplexer configured to pass the reference voltage generated by one of the plurality of reference voltage generators to the circuit configured to set and maintain the second voltage as being equal to the reference voltage, wherein the control word controls selection of the reference voltage from one of the plurality of reference voltage generators to be passed by the multiplexer.

20. The device of claim 12, wherein the second voltage is a virtual ground.

21. The device of claim 12, wherein the first voltage is a supply voltage.

22. A static random access memory (SRAM) device, comprising:
   an array of SRAM cells powered between a first voltage and a second voltage in retention mode;
   a reference voltage generator configured to generate a reference voltage that is proportional to absolute temperature, wherein a magnitude curve of the reference voltage as a function of temperature is based upon a control word;
   a circuit configured to set and maintain the second voltage as being equal to the reference voltage; and
   control circuitry configured to generate the control word based upon information about the SRAM device;
   wherein the second voltage is a virtual ground.

* * * * *